United States Patent
Yadav (10) Patent No.: US 11,053,592 B2
(45) Date of Patent: Jul. 6, 2021

(54) SUBSTRATE TEMPERATURE MONITORING (71) Applicant: Applied Materials, Inc., Santa Clara, CA (US)

(72) Inventor: Sanjay D. Yadav, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/254,295

(22) Filed: Jan. 22, 2019

(65) Prior Publication Data
US 2019/0153603 A1 May 23, 2019

Related U.S. Application Data (63) Continuation of application No. 15/188,693, filed on Jun. 21, 2016, now Pat. No. 10,184,183.

(51) Int. Cl.
| H01L 21/67 | (2006.01) |
| H01L 21/687 | (2006.01) |
| C23C 16/52 | (2006.01) |
| G01J 5/08 | (2006.01) |
| G01J 5/00 | (2006.01) |
| C23C 16/458 | (2006.01) |

(Continued)

(52) U.S. Cl.
CPC .......... *C23C 16/52* (2013.01); *C23C 16/4583* (2013.01); *C23C 16/463* (2013.01); *C23C 16/5096* (2013.01); *G01J 5/0007* (2013.01); *G01J 5/0205* (2013.01); *G01J 5/045* (2013.01); *G01J 5/0806* (2013.01); *G01J 5/0821* (2013.01); *H01L 21/67248* (2013.01); *H01L 21/68742* (2013.01); *C23C 14/541* (2013.01); *G01J 5/041* (2013.01); *G01J 2005/0081* (2013.01)

(58) Field of Classification Search
CPC ......... H01L 21/68742; H01L 21/68707; H01L 21/68741
See application file for complete search history.

(56) References Cited

U.S. PATENT DOCUMENTS

| 4,560,286 A | * | 12/1985 | Wickersheim | ............ | G01J 5/48 250/461.1 |
| 5,277,496 A | * | 1/1994 | Mayer | ...................... | G01J 5/04 250/338.1 |

(Continued)

FOREIGN PATENT DOCUMENTS

| JP | S63241436 A | 10/1988 |
| JP | H11258054 A | 9/1999 |

(Continued)

OTHER PUBLICATIONS

Korean Office Action from Application No. 10-2018-7036895 dated Jul. 20, 2020.

(Continued)

*Primary Examiner* — Binu Thomas
(74) *Attorney, Agent, or Firm* — Patterson & Sheridan, LLP (57) ABSTRACT

Embodiments disclosed herein generally relate to a substrate temperature monitoring system in a substrate support assembly. In one embodiment, the substrate support assembly includes a lift pin. The lift pin has a body. The body has an interior passage and a rounded top surface configured for contacting a substrate when in use. A substrate temperature sensor disposed in the interior passage.

15 Claims, 5 Drawing Sheets

(51) Int. Cl.
*C23C 16/46* (2006.01)
*C23C 16/509* (2006.01)
*G01J 5/04* (2006.01)
*G01J 5/02* (2006.01)
*C23C 14/54* (2006.01)

(56) References Cited

U.S. PATENT DOCUMENTS

| | | | |
|---|---|---|---|
| 5,549,756 | A | 8/1996 | Sorensen et al. |
| 5,556,204 | A * | 9/1996 | Tamura ............... C23C 16/4586 374/161 |
| 5,716,133 | A | 2/1998 | Hosokawa et al. |
| 6,086,246 | A | 7/2000 | Shufflebotham et al. |
| 6,179,466 | B1 | 1/2001 | Peuse et al. |
| 6,226,453 | B1 | 5/2001 | Yam et al. |
| 6,481,886 | B1 | 11/2002 | Narendrnath et al. |
| 2002/0030042 | A1 | 3/2002 | Ullmann et al. |
| 2003/0176000 | A1 | 9/2003 | Otsubo et al. |
| 2004/0004990 | A1 | 1/2004 | Khan |
| 2004/0258130 | A1 * | 12/2004 | Gotthold ............... G01J 5/0003 374/208 |
| 2010/0124248 | A1 | 5/2010 | Patalay et al. |
| 2013/0146569 | A1 | 6/2013 | Woods et al. |
| 2014/0269826 | A1 * | 9/2014 | Wu ................... H01L 21/67248 374/121 |
| 2015/0371881 | A1 * | 12/2015 | Du Bois ........... H01L 21/67248 374/141 |

FOREIGN PATENT DOCUMENTS

| | | |
|---|---|---|
| JP | 2008112751 A | 5/2008 |
| JP | 2015517224 A | 6/2015 |
| JP | 2016076529 A | 5/2016 |
| KR | 20123011878 A | 2/2012 |
| KR | 20140004734 A | 1/2014 |
| TW | 201410081 A | 3/2014 |

OTHER PUBLICATIONS

International Search Report and Written Opinion for PCT/US2017/035988 dated Aug. 31, 2017.

Taiwan Office Action dated Nov. 26, 2018 for Application No. 106118870.

Office Action from Japanese Patent Application No. 2018-566425 dated Feb. 18, 2020.

* cited by examiner

SUBSTRATE TEMPERATURE MONITORING

CROSS-REFERENCE TO RELATED APPLICATIONS

This application claims benefit of U.S. patent application Ser. No. 15/188,693, filed Sep. 19, 2012, and now granted as U.S. Pat. No. 10,184,183, of which is incorporated by reference in its entirety.

BACKGROUND

Field

Embodiments described herein generally relate to a substrate temperature monitoring system.

Description of the Related Art

Flat panel displays (FPD) are commonly used for active matrix displays such as computer and television monitors, personal digital assistants (PDAs), and cell phones, as well as solar cells and the like. Plasma enhanced chemical vapor deposition (PECVD) may be employed in flat panel display fabrication to deposit thin film on a substrate. PECVD is generally accomplished by executing a precursor gas into a plasma within a vacuum process chamber and depositing a film on a substrate from the excited precursor gas.

During deposition, the plasma within the vacuum processing chamber heats the substrate and the substrate support assembly. The plasma may cause the temperature of the substrate support assembly to have a temporal temperature increase or spike (e.g., about 30-50° C. increase, or 20%-30% temperature increase from 150° C.). Such a large temperature increase of the substrate support assembly undesirably causes process variation.

Thus, there is a need for an improved substrate temperature monitoring system for a substrate support assembly.

SUMMARY

Embodiments disclosed herein generally relate to a substrate temperature monitoring system in a substrate support assembly. In one embodiment, the substrate support assembly includes a lift pin. The lift pin has a body. The body has an interior passage and a rounded top surface configured for contacting a substrate when in use. A substrate temperature sensor disposed in the interior passage.

In another embodiment, a processing chamber is disclosed herein. The processing chamber has a chamber body comprising a top wall, a sidewall, and a bottom wall defining a processing region in the chamber body. A substrate support assembly is disposed in the processing region. The substrate support has a support plate having a top surface configured to support a substrate. A substrate temperature monitoring system is disposed in the support plate and is configured to measure a temperature of the substrate from a bottom surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
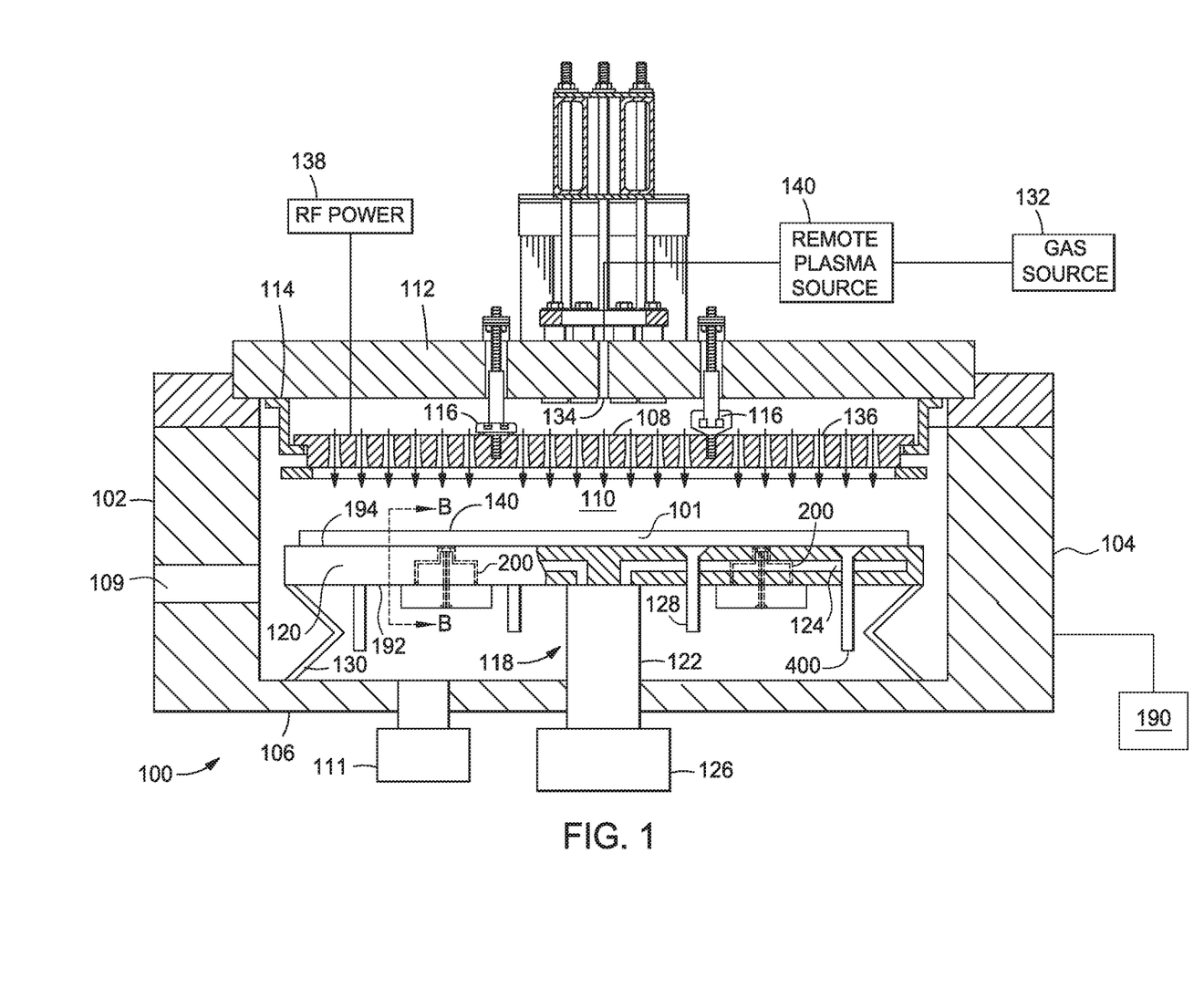
FIG. 1 illustrates a cross-sectional view of a processing chamber having a substrate support assembly disposed therein, according to one embodiment.

FIG. 1 illustrates a cross-sectional view of a processing chamber 100 having a substrate support assembly 118 that includes at least one temperature monitoring system, according to one embodiment. The processing chamber 100 may include a chamber body 102 having sidewalls 104, and a bottom 106 that define a processing volume 110. The processing volume 110 is accessed through an opening 109 formed through the sidewalls 104.

A showerhead 108 is disposed in the processing volume 110. The showerhead 108 may be coupled to a backing plate 112. For example, the showerhead 108 may be coupled to the backing plate 112 by a suspension 114 at the end of the backing plate 112. One or more coupling supports 116 may be used to couple the showerhead 108 to the backing plate 112 to aid in preventing sag.

The substrate support assembly 118 is also disposed in the processing volume 110. The substrate support assembly 118 includes a support plate 120 and a stem 122 coupled to the support plate 120. The support plate 120 is configured to support a substrate 101 during processing. The support plate 120 includes temperature control elements 124. The temperature control elements 124 are configured to maintain the substrate support assembly 118 at a desired temperature. The temperature control elements 124 run up through the stem 122 and extend below and across the entire upper surface of the support plate 120.

As noted above, the substrate support assembly 118 may include one or more substrate temperature monitoring systems 200, 300, and 400 disposed therein. The substrate temperature monitoring systems 200, 300, and 400 are configured to measure a temperature of the substrate 101 during processing. The substrate temperature monitoring systems 200-400 may be coupled to a proportional-integral-derivative (PID) controller 190. The PID controller 190 configured to continually read the temperature of the substrate and adjust the amount of cooling fluid supplied to the temperature control elements 124. The substrate temperature monitoring systems 200-400 are discussed in more detail below, in conjunction with FIGS. 2-4B.

A lift system 126 may be coupled to the stem 122 to raise and lower the support plate 120. Lift pins 128 are moveably disposed through the support plate 120 to space the substrate 101 from the support plate 120 to facilitate robotic transfer of the substrate 101. The substrate support assembly 118 may also include RF return straps 130 to provide an RF return path at an end of the substrate support assembly 118.

A gas source 132 may be coupled to the backing plate 112 to provide processing gas through a gas outlet 134 in the backing plate 112. The processing gas flows from the gas outlet 134 through gas passages 136 in the showerhead 108. A vacuum pump 111 may be coupled to the chamber 100 to control the pressure within the processing volume 110. An RF power source 138 may be coupled to the backing plate 112 and/or to the showerhead 108 to provide RF power to the showerhead 108. The RF power creates an electric field between the showerhead 108 and the substrate support assembly 118 so that a plasma may be generated from the gases between the showerhead 108 and the substrate support assembly 118.

A remote plasma source 140, such as an inductively coupled remote plasma source, may also be coupled between the gas source 132 and the backing plate 112. Between processing substrates, a cleaning gas may be provided to the remote plasma source 140 so that a remote plasma is generated and provided into the processing volume 110 to clean chamber components. The cleaning gas may be further excited while in the processing volume 110 by power applied to the showerhead 108 from the RF power source 138. Suitable cleaning gases include but are not limited to $NF_3$, $F_2$, and $SF_6$.

Figure 2:
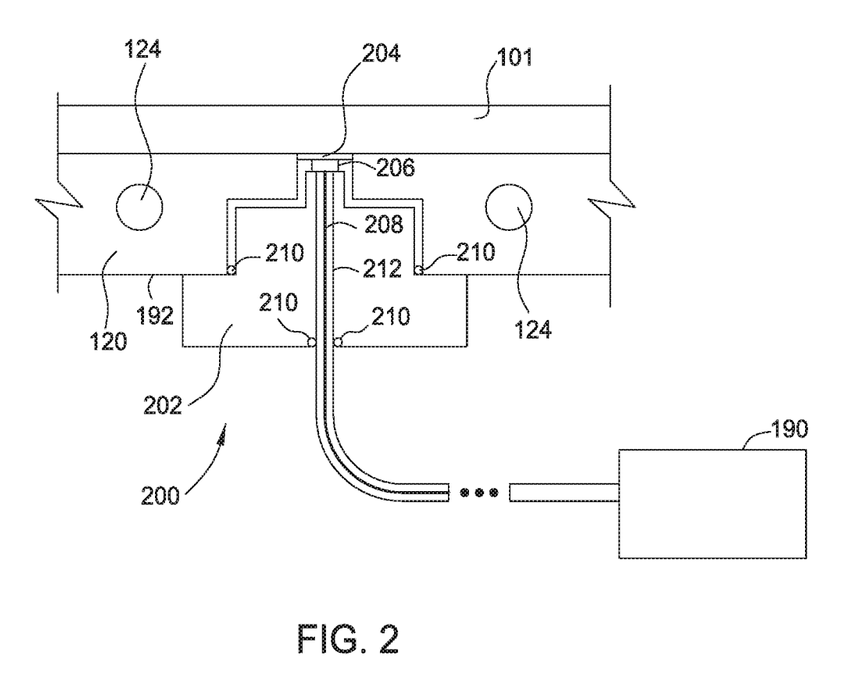
FIG. 2 illustrates a cross sectional view of the support plate of FIG. 1, revealing a substrate temperature monitoring system, according to one embodiment.

FIG. 2 illustrates a cross sectional view taken of the support plate 120 through section line B-B depicted in FIG. 1, revealing the substrate temperature monitoring system 200, according to one embodiment. The substrate temperature monitoring system 200 includes a body 202 having an interior passage 212 and a window 204. The body 202 is embedded in the support plate 120 through a bottom surface 192 of the support plate 120. In the embodiment shown in FIG. 2, the body 202 is a hex-headed plug that is screwed into the support plate 120. One or more seals 210 may be positioned between the support plate 120 and the body 202 to seal the body 202 to the support plate 120.

The window 204 may be positioned below or flush with the top surface 194 of the support plate 120. The flush/recessed window 204 allows the substrate 101 to lay flat on the support plate 120. The window 204 may be formed from a transparent material. For example, the window 204 may be formed from sapphire, yttrium, or other suitable material.

The substrate temperature monitoring system 200 further includes a temperature sensor 206 and fiber tube 208. The temperature sensor 206 and fiber tube 208 are disposed in the interior passage 212 of the body 202. The temperature sensor 206 is disposed beneath the window 204, such that the temperature sensor 206 may measure a temperature of the substrate 101 during processing. The fiber tube 208 couples the temperature sensor 206 to the PID controller 190. The plurality of seals 210 may also be positioned between the fiber tube 208 and the body 202.

Figure 3A:
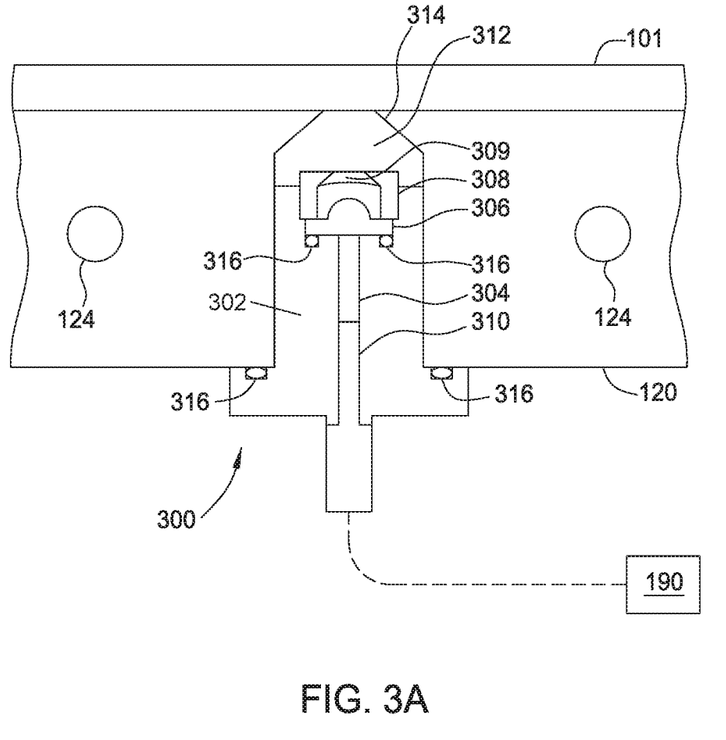
FIG. 3A illustrates a cross sectional view of the support plate of FIG. 1, revealing a substrate temperature monitoring system, according to another embodiment.

FIG. 3A is a cross-sectional view of the support plate 120, revealing a substrate temperature monitoring system 300, according to one embodiment. The substrate temperature monitoring system 300 includes a body 302 defining an interior passage 304, a lens 306, an aperture nut 308, and an optical fiber tube 310. The body 302 is disposed in the support plate 120, beneath a tapped hole 312 formed in the support plate 120. The aperture nut 308 is disposed in the body 302. The aperture nut 308 is configured to hold the lens 306 in place. The aperture nut 308 includes a conical aperture 309 that is aligned with the lens 306. The optical fiber tube 310 is disposed in the interior passage 304, beneath the lens 306. For example, the optical fiber tube 310 is screwed into the body 302 using an SMA 905 connection on the optical fiber tube 310. The fiber tube 310 is configured to receive a focused IR beam coming from the bottom of the substrate 101 through the lens 306. The fiber tube 310 is coupled to PID controller 190 that determines a temperature of the substrate 101 based on the received IR rays emitted from the bottom of the substrate 101.

In one embodiment, the lens 306 is a plano-convex lens, which focuses the IR rays emitting from the substrate 101 back to the fiber tube 310. The fiber tube 310 has an acceptance cone angle (or numerical aperture) requirement. For example, a 1000 μm fiber has an output divergence half angle of about 30 mRad, which corresponds to a half cone angle of 1.7 degrees, or full cone angle of 3.4 degrees. If the rays entering the fiber tube 310 from the substrate underfill or overfill the fiber tube 310, the transmission through the fiber tube 310 suffers, and thus, the detector will read a misrepresentation of the temperature (i.e., low signal to noise ratio). The lens 306 enhances IR transmission by making sure that the IR rays entering the fiber tube 310 are within the acceptance cone of the fiber tube 310. Additionally, the tapped hole 312 formed in the support plate 120 has a conical shaped end 314. The conical shaped end 314 is configured to prevent IR beam clipping coming from the substrate. If the hole 312 was purely vertical, the light beam coming from the substrate 101 would be clipped, and hence, result in loss of signal.

The lens 306 may be formed from a transparent material. For example, in one embodiment, the lens 306 may be formed from $MgF_2$ (magnesium fluoride), $CaF_2$ (calcium fluoride), $BaF_2$ (barium fluoride), or $Yr_2O_3$ (crystalline yttria). The material of the lens 306 provides a sufficient chemical robustness to guard against the harsh cleaning agents used in a CVD process (e.g., an $NF_3$ cleaning agent, which is highly corrosive). Directly exposing the fiber tube 310 to $NF_3$ will gradually cause the fiber tube 310 to be etched away, thus reducing the effectiveness of signal transmission over time. The material of the lens 306 also exhibits enhanced transmission properties in the wavelength of interest (i.e., 5-15 μm). Thus, the lens 306 has superior performance compared to conventional lenses fabricated from an amorphous material transmitting infrared radiation (AM-TIR). AMTIR is less chemically stable (i.e., will be etched by $NF_3$ over a period of time) and also has less overall transmission (about 70%) as opposed to the materials from which the lens 306 is fabricated, which has about 93% transmission in the same wavelength range.

The aperture in the aperture nut 308 is configured to reduce the numerical aperture of the incoming rays and maintain the numerical aperture of image side rays within the acceptance code of the fiber. O-rings 316 are positioned beneath the lens 306, which are configured to seal and, hence, prevent the fiber tube 310 from being attacked by $NF_3$ cleaning agent. The aperture nut 308 is also configured to provide the compressive force to squeeze the o-rings 316 into their grooves.

The aperture nut 308 is formed from a low-emissivity, polished material. The low emissivity material enhances the substrate temperature monitoring system 300 because when the support plate 120 becomes hot during the process, the body 302 and the aperture nut 308 will also become hot. Hot objects tend to emit IR radiation at certain temperatures. These IR rays would be collected by the optical fiber tube 310, resulting in false temperature readings. Thus, the low emissivity material ensures that the aperture nut 308 will not radiate a lot of heat.

Figure 3B:
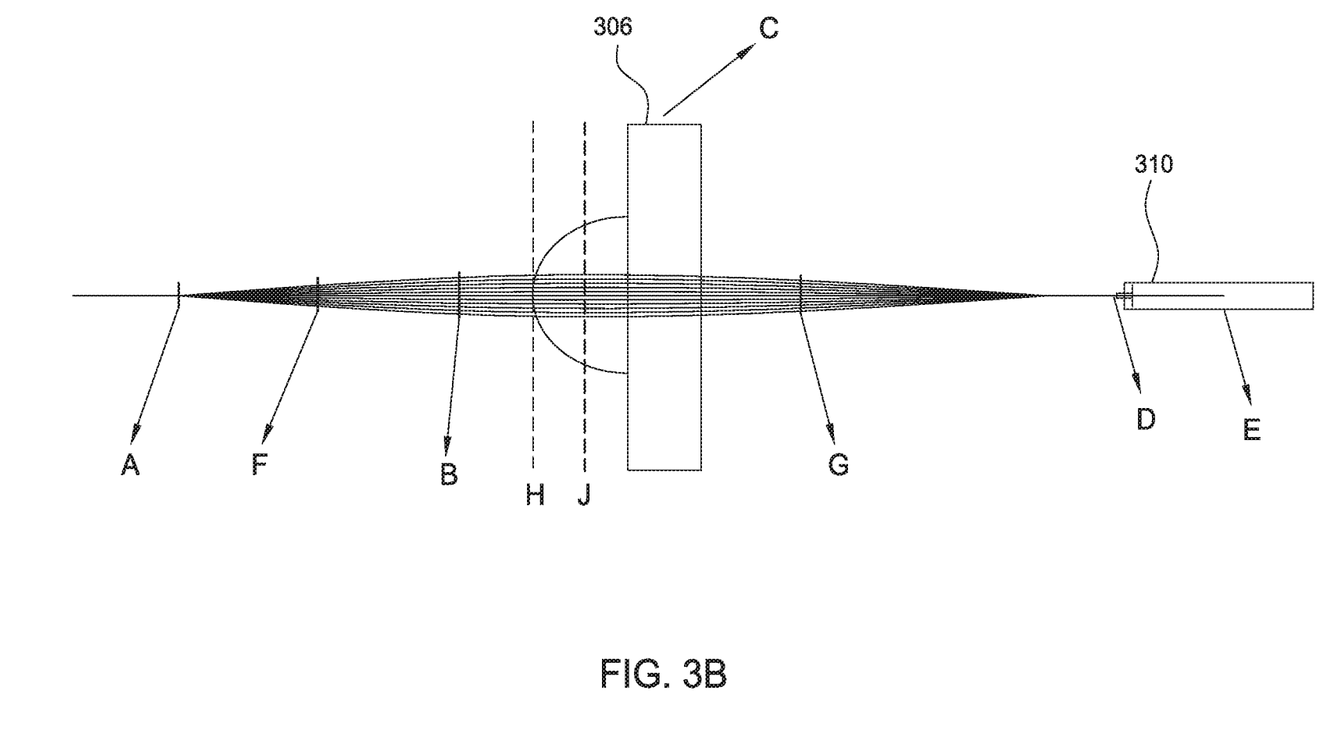
FIG. 3B illustrates a ray trace diagram 350 of the substrate temperature monitoring system, according to one embodiment.

FIG. 3B illustrates an optical ray trace 350 of the substrate temperature monitoring system 300 in FIG. 3A. Point A illustrates the location of the object, which is a bottom surface of the substrate 101. Point B illustrates the location of the aperture in the aperture nut 308, which is used to limit the numerical aperture of the object, and thus the numerical aperture of the image. Point C illustrates the location of the lens 306. Point D illustrates the location of the image. The optical fiber tube 310 is positioned at point D. The numerical aperture of the beam emerging from the lens 306 should match the numerical aperture of the optical fiber tube 310. Point E illustrates the location of the optical fiber tube 310, adjacent to point D. Point F illustrates the location of a focal point of the lens 306 on the object side. Point G illustrates the location of a focal point of the lens 306 on the image side. Points H and J illustrate the principal planes of the lens 306. The aperture at point B is placed between the object side focal point at point F and the first principal plane at point H. By doing so, the aperture will form a virtual image behind the lens 306, thus enhancing the temperature readings.

Figure 4A:
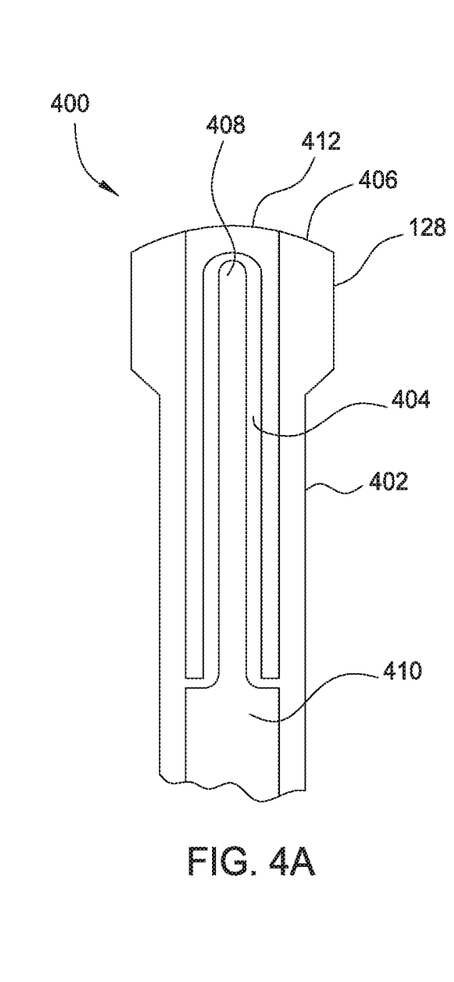
FIGS. 4A-4B illustrate a substrate temperature monitoring system in the form of a lift pin, according to one embodiment.
Figure 4B:
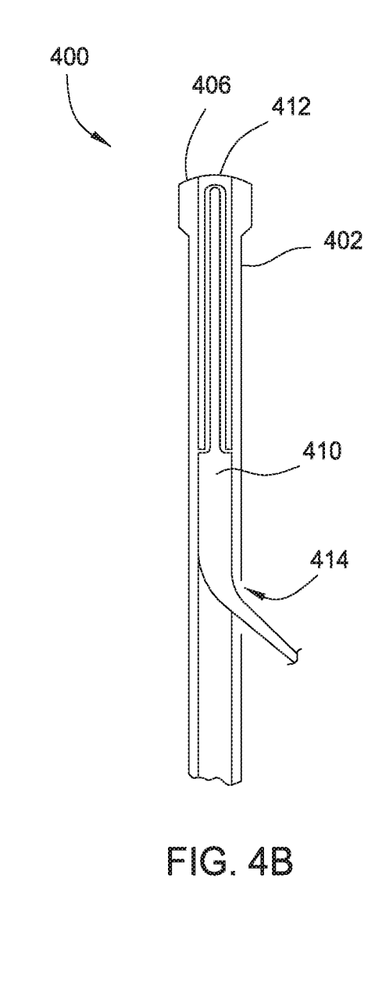

FIGS. 4A and 4B illustrate a substrate temperature monitoring system 400 in the form of lift pin 128, according to one embodiment. FIG. 4A illustrates a cross-sectional view of the lift pin 128. The lift pin 128 includes a body 402 having an interior passage 404. The body 402 may include a rounded top surface 406 for contacting the substrate when in use.

The lift pin 128 further includes a temperature sensor 408, a fiber tube 410, and a cap 412. The temperature sensor 408 may be disposed in the interior passage 404 of the body 402. The cap 412 may be integrally formed with the top surface 406. The cap 412 is positioned about the temperature sensor 408, such that the cap 412 protects the temperature sensor 408 from contacting the substrate 101 or body 402. In one embodiment, such as that shown in FIGS. 4A-4B, the cap 412 may extend down an entire length, L, of the temperature sensor 408. The cap 412 may be formed from a conductive material, such as aluminum. The fiber tube 410 is disposed in the interior passage 404. The fiber tube 410 is configured to couple the temperature sensor 408 with the controller 190.

In operation, the lift pin 128 is configured to raise the substrate 101 off the top surface 194 of the support plate 120 by contacting the substrate 101 with the top surface 406 of the lift pin 128. Because the top surface 406 of the lift pin 128 is rounded, the cap 412 is the portion of the top surface 406 that contacts the bottom surface of the substrate 101. The temperature sensor 408 is configured to measure a temperature of the substrate 101 when the lift pin 128 is in contact with the substrate 101.

In another embodiment, the body 402 may include an opening 414 formed in a side of the body 402. The opening 414 allows the fiber tube 410 to exit the lift pin 128 through the side and couple the temperature sensor 408 to the PID controller 190. This ensures that the fiber tube 410 is not damaged when the substrate support assembly 118 is lowered and the lift pin 128 is displaced through contact with another object at the bottom of the pin 128, for example by the bottom surface 106 of the chamber 100 when the substrate support assembly 118 is lowered to a transfer position.

The substrate temperature monitoring system 400 provides a contact method of measuring and controlling the temperature of the substrate 101.

While the foregoing is directed to specific embodiments, other and further embodiments may be devised without departing from the basic scope thereof, and the scope thereof is determined by the claims that follow.

What is claimed is:

1. A lift pin for a processing chamber, the lift pin comprising:
   a body comprising:
      an interior passage;
      a rounded top surface configured for contacting a substrate when in use;
      a side of the body formed integrally with and extending below the rounded top surface; and
      a cap disposed in the interior passage formed integrally with and extending below the rounded top surface, wherein the cap and a portion of the side of the body form a continuous arc in the rounded top surface;
      a substrate temperature sensor disposed in the interior passage; and
      a fiber tube coupled to and extending beneath the substrate temperature sensor.

2. The lift pin of claim 1, wherein the cap is positioned about the substrate temperature sensor such that the cap protects the substrate temperature sensor from contacting the substrate or the body.

3. The lift pin of claim 1, wherein the cap is the portion of the lift pin that contacts the substrate.

4. The lift pin of claim 1, wherein the cap extends down an entire length of the substrate temperature sensor.

5. The lift pin of claim 1, wherein the cap is formed from a conductive material.

6. The lift pin of claim 5, wherein the conductive material comprises aluminum.

7. The lift pin of claim 1, wherein the fiber tube is disposed in the interior passage.

8. The lift pin of claim 1, wherein the fiber tube is configured to couple the substrate temperature sensor to a controller.

9. The lift pin of claim 1, wherein the substrate temperature sensor is configured to measure a temperature of the substrate when the lift pin is in contact with the substrate.

10. The lift pin of claim 9, wherein the body further comprises:
    an opening formed in a side of the body.

11. The lift pin of claim 10, wherein the fiber tube exits the opening and couples the substrate temperature sensor to a controller.

12. A processing chamber, comprising:
    a chamber body comprising a top wall, a sidewall, and a bottom wall defining a processing region in the chamber body; and
    a substrate support assembly disposed in the processing region, the substrate support assembly comprising:
    a support plate having a top surface configured to support a substrate, the support plate having a lift pin configured to move the substrate relative to the top surface, the lift pin having a body, the body comprising:
    an interior passage;
    a rounded top surface configured for contacting a substrate when in use;
    a side of the body formed integrally with and extending below the rounded top surface; and
    a cap disposed in the interior passage formed integrally with and extending below the rounded top surface, wherein the cap and a portion of the side of the body form a continuous arc in the rounded top surface;

a substrate temperature monitoring system disposed in the interior passage of the lift pin, the substrate temperature monitoring system configured to measure a temperature of the substrate from a bottom surface of the substrate; and a fiber tube coupled to and extending beneath the substrate temperature monitoring system.

13. The processing chamber of claim 12, wherein the substrate temperature monitoring system comprising:

a temperature sensor disposed in the interior passage, the temperature sensor configured to measure the temperature of the substrate;

wherein the cap is configured to protect the temperature sensor from contacting the body.

14. The lift pin of claim 1, wherein a portion of the cap forms an apex of the continuous arc of the rounded top surface.

15. The processing chamber of claim 12, wherein a portion of the cap forms an apex of the continuous arc of the rounded top surface.

* * * * *